(12) United States Patent
Peng et al.

(10) Patent No.: US 12,702,029 B2
(45) Date of Patent: Aug. 4, 2026

(54) GROUND PIN PACKAGE SUBSTRATE, SEMICONDUCTOR DEVICE, AND ELECTRONIC DEVICE

(71) Applicant: Huawei Technologies Co., Ltd., Shenzhen (CN)

(72) Inventors: Xiping Peng, Dongguan (CN); Zhenhua Yuan, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 379 days.

(21) Appl. No.: 18/474,775

(22) Filed: Sep. 26, 2023

(65) Prior Publication Data

US 2024/0014122 A1      Jan. 11, 2024

Related U.S. Application Data

(63) Continuation of application No. PCT/CN2022/080813, filed on Mar. 15, 2022.

(30) Foreign Application Priority Data

Mar. 26, 2021    (CN) .......................... 202110327232.8

(51) Int. Cl.
    *H10W 70/65*          (2026.01)
    *H10W 90/00*          (2026.01)
(52) U.S. Cl.
    CPC ......... *H10W 70/65* (2026.01); *H10W 90/701* (2026.01)
(58) Field of Classification Search
    CPC ........... H01L 2224/81; H01L 23/49816; H01L 23/49838; G11C 5/04; G11C 5/066
    See application file for complete search history.

(56) References Cited

U.S. PATENT DOCUMENTS

| | | | |
|---|---|---|---|
| 7,259,453 B2 | 8/2007 | Young | |
| 2003/0052417 A1 | 3/2003 | Hosaka | |
| 2016/0181682 A1* | 6/2016 | Zhao ...................... | H05K 1/111 |
| | | | 333/5 |

FOREIGN PATENT DOCUMENTS

| | | |
|---|---|---|
| CN | 107393898 A | 11/2017 |
| JP | 2016045613 A | 4/2016 |

OTHER PUBLICATIONS

Written search report for WO 2022199420, Dec. 9, 2022 (Year: 2022).*
Written search report for WO 2023103701 (Year: 2023).*

* cited by examiner

*Primary Examiner* — Telly D Green
(74) *Attorney, Agent, or Firm* — Conley Rose, P.C.

(57)          ABSTRACT

A package substrate includes a substrate body and a plurality of unit regions disposed on the substrate body. The unit region includes two first solder ball structures. The first solder ball structure includes six first solder balls. The six first solder balls are arranged, with two of them in a row, to form three parallel rows of two solder balls: a first row of solder balls, a second row of solder balls, and a third row of solder balls. Four first solder balls in the first row of solder balls and the second row of solder balls are respectively located at four vertices of one parallelogram, and four first solder balls in the second row of solder balls and the third row of solder balls are respectively located at four vertices of the other parallelogram, and the two parallelograms are arranged axisymmetric about the second row of solder balls.

20 Claims, 5 Drawing Sheets

GROUND PIN PACKAGE SUBSTRATE, SEMICONDUCTOR DEVICE, AND ELECTRONIC DEVICE

CROSS-REFERENCE TO RELATED APPLICATIONS

This is a continuation of International Patent Application No. PCT/CN2022/080813 filed on Mar. 15, 2022, which claims priority to Chinese Patent Application No. 202110327232.8 filed on Mar. 26, 2021. The disclosures of the aforementioned applications are hereby incorporated by reference in their entireties.

TECHNICAL FIELD

This disclosure relates to the field of electronic device technologies, and in particular, to a package substrate, a semiconductor device, and an electronic device.

BACKGROUND

With the development of computer technologies and communications technologies, a rate of data exchange between a processor and a memory chip of some electronic devices such as communications devices, servers, and computers is continuously improved, which continuously raises requirements for a memory bus bit width, a storage density, and the like, and also poses a corresponding challenge to chip packaging technologies. For pin arrangement of a package substrate of a chip, there are two main requirements. One is to minimize electromagnetic crosstalk between pins, and the other is to minimize the package area of the chip, that is, to implement high-density arrangement of pins. However, increasing the pin arrangement density inevitably causes an increase in electromagnetic crosstalk. In view of this, how to arrange the pins of the package substrate with low crosstalk and high density has become a technical problem needing to be urgently resolved at present.

SUMMARY

This disclosure provides a package substrate, a semiconductor device, and an electronic device, to reduce crosstalk between pins of a chip, and reduce a packaging area by increasing an arrangement density of pins, thereby reducing development costs of the semiconductor device.

According to a first aspect, this disclosure provides a package substrate, where the package substrate includes a substrate body and a plurality of unit regions disposed on the substrate body. A unit region may include two first solder ball structures, and each first solder ball structure may include six first solder balls. The six first solder balls may be arranged, with two of them in a row, to form three rows of solder balls that are parallel to each other: a first row of solder balls, a second row of solder balls, and a third row of solder balls. The four first solder balls in the first row of solder balls and the second row of solder balls may be respectively located at four vertices of a parallelogram, and the four first solder balls in the second row of solder balls and the third row of solder balls may be respectively located at four vertices of the other parallelogram. In this case, a connection line between the two first solder balls in the second row of solder balls becomes a common side of the two parallelograms, and the two parallelograms are arranged axisymmetric about the second row of solder balls.

In the foregoing solution, the six first solder balls included in the first solder ball structure in the unit region are arranged in a double-parallelogram manner, which can not only help reduce crosstalk between the first solder balls, but also can increase an arrangement density of the first solder balls, thereby reducing a packaging area and further reducing development costs of a semiconductor device.

During specific arrangement, two first solder ball structures in each unit region may be arranged opposite to each other, and the second rows of solder balls of the two first solder ball structures may be arranged in a collinear manner. In this way, each unit region occupies less space, thereby reducing a packaging area.

In some possible implementation solutions, the six first solder balls in the first solder ball structure may be respectively two differential signal solder balls and four single-ended signal solder balls, where the two differential signal solder balls are a pair. During specific arrangement, the two differential signal solder balls may be located in the second row of solder balls, that is, a side formed by a connection line of the two differential signal solder balls is a common side of the two parallelograms, and the four single-ended signal solder balls are respectively arranged in the first row of solder balls and the third row of solder balls. Based on a symmetric structure of the two parallel quadrilaterals, two single-ended solder balls in the first row and two single-ended solder balls in the third row are symmetrically distributed on two sides of a pair of differential signal solder balls. Because the two signals of the pair of differential signal solder balls have equal amplitudes and opposite phases, impact of the pair of differential signal solder balls on the single-ended signal solder balls can be mutually offset, thereby reducing electromagnetic interference caused by differential signals to single-ended signals.

In some possible implementation solutions, ground solder balls may be arranged around a first solder ball structure to reduce mutual crosstalk between adjacent first solder ball structures.

A plurality of ground solder balls may be arranged around a first solder ball structure, so that return current solder balls may be formed around the first solder ball structure, thereby reducing electromagnetic interference between the first solder ball structure and another first solder ball structure.

During specific arrangement, a quantity of ground solder balls arranged around each first solder ball structure may be 11, and connection lines of the 11 ground solder balls sequentially arranged along a periphery of a first solder ball structure may form a nonagon. In this arrangement manner, a larger quantity of ground solder balls may be arranged around each single-ended signal solder ball, thereby effectively reducing electromagnetic crosstalk between signals.

In some possible implementation solutions, a first solder ball structure may include a first side, a second side, a third side, and a fourth side. The first side is a side that is of the first solder ball structure and that is away from another first solder ball structure in a unit region. The second side is opposite to the first side. The third side and the fourth side are both located between the first side and the second side, and the third side is opposite to the fourth side. On the first side of the first solder ball structure, connection lines of a plurality of ground solder balls may form a sawtooth shape. On the second side of the first solder ball structure, connection lines of a plurality of ground solder balls may form a trapezoid shape. On the third side and the fourth side of the first solder ball structure, connection lines of a plurality of ground solder balls are respectively in a straight-line shape. This arrangement manner can better match an arrangement form of the double parallelograms of the first solder ball structure, so that the 11 ground solder balls may be close to an outer side of single-ended signal solder balls, thereby decreasing an arrangement area of ground solder balls and further reducing a packaging area.

In each unit region, the two first solder ball structures may share a plurality of ground solder balls on their respective second sides. In this way, a quantity of arranged ground solder balls can be reduced without compromising a signal anti-interference capability, thereby decreasing an arrangement area of ground solder balls.

In some possible implementation solutions, two unit regions adjacent in a row direction are staggered along a column direction. The first sides of the two adjacent first solder ball structures that are respectively located in the two adjacent unit regions in the row direction have an overlapping part, and the two unit regions adjacent in the row direction may share a plurality of ground solder balls in the overlapping part. In this way, a quantity of ground solder balls that are arranged can be reduced without compromising the signal anti-interference capability.

In some possible implementation solutions, two unit regions adjacent in a column direction may be symmetrically arranged, and in two symmetric first solder ball structures in the two unit regions adjacent in a column direction, a third side of one first solder ball structure and a fourth side of the other first solder ball structure overlap, and an overlapping side of the two first solder ball structures may share a plurality of ground solder balls. Similarly, this arrangement manner may also reduce a quantity of arranged ground solder balls without compromising the signal anti-interference capability.

According to a second aspect, this disclosure further provides a semiconductor device. The semiconductor device may include a chip and the package substrate in any one of the foregoing possible implementation solutions. The chip is arranged on the package substrate, and signal pins on the chip are electrically connected to a plurality of first solder balls on the package substrate. The arrangement manner of solder balls on the package substrate may not only reduce electromagnetic crosstalk between signals, but increase an arrangement density of solder balls, thereby reducing a packaging area and further reducing development costs of the semiconductor device.

In some possible implementation solutions, a chip may be further a central processing unit. The central processing unit is provided with a plurality of memory channels. A memory channel includes a plurality of byte units, and each byte unit corresponds to one unit region. A first solder ball in a unit region may be used to transmit data signals of a corresponding byte unit.

According to a third aspect, this disclosure further provides an electronic device. The electronic device may include a circuit board and the semiconductor device in the foregoing solution. The semiconductor device is disposed on the circuit board, and signal pins configured to connect to the semiconductor device are disposed on the circuit board. In this way, the semiconductor device may be connected to another device by using the signal pins and a trace on the circuit board, thereby implementing a connection between a chip and an external circuit.

REFERENCE NUMERALS

100: circuit board; 200: semiconductor device; 10: package substrate; 20: chip; 30: heat dissipation substrate; 40: filling adhesive; 11: substrate body; 12: first solder ball structure; 13: first solder ball; 1201: first row of solder balls; 1202: second row of solder balls; 1203: third row of solder balls; 14: unit region; 15: differential signal solder ball; 16, 16a, 16b, 16c, and 16d: single-ended signal solder balls; 17: ground solder ball; 21: CPU; 22: DDR channel; 23: byte unit.

DESCRIPTION OF EMBODIMENTS

To make the objectives, technical solutions, and advantages of this disclosure clearer, the following further describes this disclosure in detail with reference to the accompanying drawings. It should be noted that, in the description of this disclosure, "at least one" means one or more, and "a plurality of" means two or more. In view of this, in embodiments of the present disclosure, "a plurality of" may also be understood as "at least two". The term "and/or" describes an association relationship between associated objects and indicates that three relationships may exist. For example, A and/or B may indicate the following three cases: only A exists, both A and B exist, and only B exists. In addition, the character "/", unless otherwise specified, generally indicates an "or" relationship between the associated objects. In addition, it should be understood that terms such as "first" and "second" in the description of this disclosure are merely used for distinguishing and description, but should not be understood as indicating or implying relative importance, or should not be understood as indicating or implying a sequence.

Reference to "an embodiment", "some embodiments", or the like described in this specification indicates that one or more embodiments of this disclosure include a specific feature, structure, or characteristic described with reference to the embodiments. Therefore, statements such as "in an embodiment", "in some embodiments", "in some other embodiments", and "in other embodiments" that appear at different places in this specification do not necessarily refer to a same embodiment. Instead, the statements mean "one or more but not all of embodiments", unless otherwise emphasized in another manner. The terms "include", "comprise", and "have", and variants thereof all mean "include but are not limited to", unless otherwise emphasized in another manner.

Figure 1:
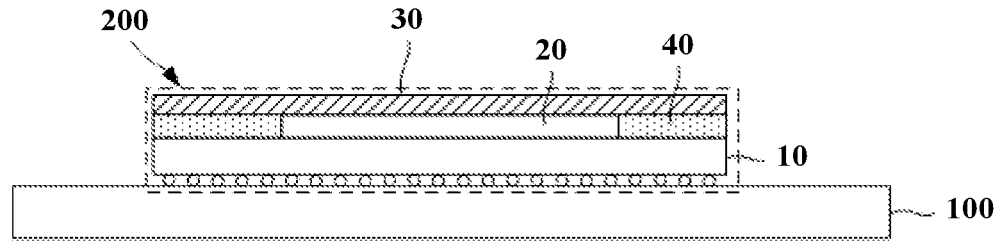
FIG. 1 is a schematic diagram of a local structure of an electronic device according to an embodiment of this disclosure.

FIG. 1 is a schematic diagram of a partial structure of an electronic device according to an embodiment of this disclosure. The electronic device may be a device in a conventional technology, such as a communications device, a server, a super computer, a router, or a switch. The electronic device may include a circuit board 100 and a semiconductor device 200 disposed on the circuit board 100. The semiconductor device 200 may include a package substrate 10 and a chip 20. The package substrate 10 is used as a carrier of the chip 20, and may be used to provide the chip 20 with various functions, such as electrical connection, protection, support, heat dissipation, and assembly. During packing of the semiconductor chip, the chip 20 may be placed on the package substrate 10, and all pins on the chip 20 are connected to solder balls or solder pads of the package substrate 10 by using wire bonding or flip chip technologies.

To improve heat dissipation of the chip 20, a heat dissipation substrate 30 may be further disposed on a side that is of the chip 20 and that is away from the package substrate 10. Heat generated when the chip 20 operates may be dissipated to the outside through the lower-side package substrate 10 and the upper-side heat dissipation substrate 30. A filling adhesive 40 may be further disposed between the package substrate 10 and the heat dissipation substrate 30. The filling adhesive 40 may be configured to wrap the chip 20, to reduce adverse impact of external dust, impurities, and the like on performance of the chip 20. In addition, the filling adhesive 40 may be further configured to bond components together, such as the package substrate 10, the heat dissipation substrate 30, and the chip 20, thereby improving structural reliability of the semiconductor device 200.

The semiconductor device 200 may be fastened onto the circuit board 100 through soldering or the like. Signal pins configured to connect to the semiconductor device 200 may be disposed on the circuit board 100. External pins on the semiconductor device 200 may be electrically connected to the signal pins, and then connected to another device by using the signal pins and a trace on the circuit board 100 in sequence, to implement connection between the internal chip 20 and an external circuit.

Quality of a semiconductor packaging technology directly affects performance of the chip 20 and design and manufacturing of the circuit board 100 connected to the chip 20. An important indicator for measuring performance of the semiconductor packaging technology is a ratio of an area of the chip 20 to a packaging area. A smaller value of the ratio indicates a larger packaging area, that is, a larger size of the semiconductor device 200. An increase in a size of the semiconductor device 200 causes a decrease in a manufacturing yield of the semiconductor device and an increase in a soldering risk of the circuit board 100, and further increases manufacturing costs and a reliability risk of product. On the contrary, if the ratio of the area of the chip 20 to the packaging area is closer to 1, it indicates that the packaging area is smaller. In this case, the manufacturing yield of the semiconductor device 200 is higher, and the manufacturing costs may be correspondingly reduced. An arrangement density of pins on the package substrate 10 plays a key role in affecting the packaging area. In order to reduce the packaging area, the arrangement density of the pins needs to be increased. However, on the other side, excessively high pin arrangement density causes electromagnetic crosstalk between pins, thereby affecting performance of the chip.

To resolve this problem, this disclosure provides a package substrate. The package substrate may reduce crosstalk between pins, and may improve pin utilization through proper pin arrangement, thereby reducing the packaging area and reducing development costs of the semiconductor device 200. The following describes in detail the package substrate provided embodiments of this disclosure with reference to the accompanying drawings.

Figure 2:
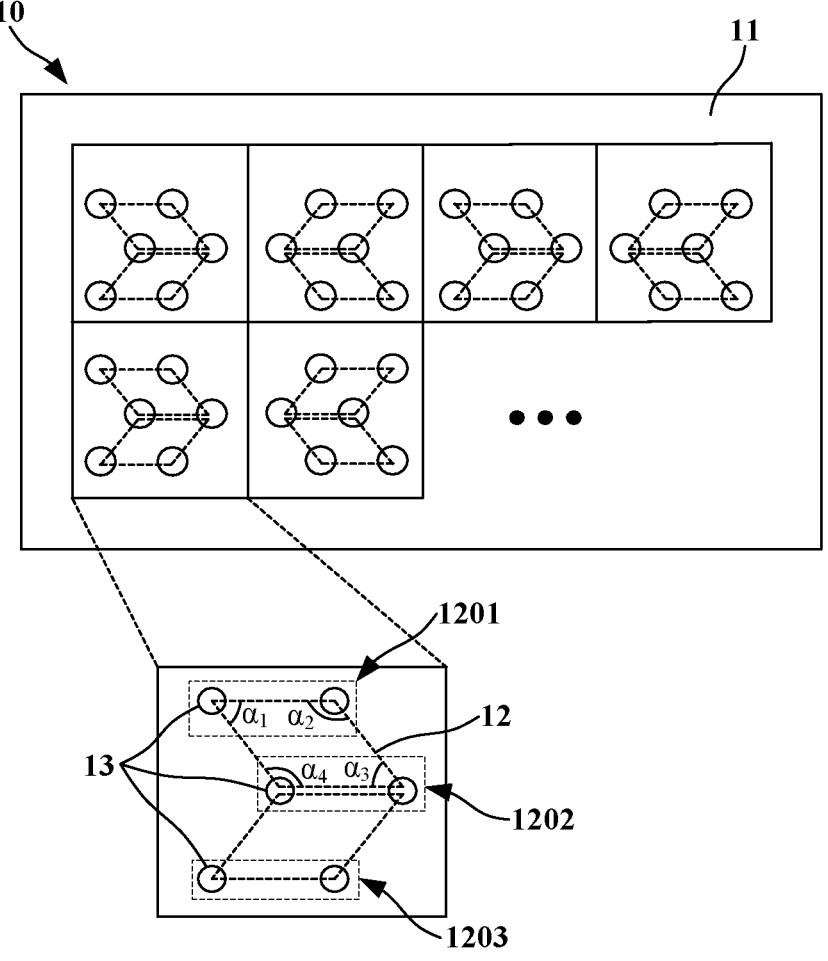
FIG. 2 is a schematic diagram of a structure of a package substrate according to an embodiment of this disclosure.

FIG. 2 is a schematic diagram of a structure of a package substrate according to an embodiment of this disclosure. As shown in FIG. 2, the package substrate 10 may include a substrate body 11 and a plurality of first solder ball structures 12 disposed on the substrate body 11. Each first solder ball structure 12 may include six first solder balls 13. The six first solder balls 13 may be arranged, with two of them in a row, to form a first row of solder balls 1201, a second row of solder balls 1202, and a third row of solder balls 1203. The first row of solder balls 1201, the second row of solder balls 1202, and the third row of solder balls 1203 are parallel to each other. The four first solder balls 13 in the first row of solder balls 1201 and the second row of solder balls 1202 may be respectively located at four vertices of a parallelogram, and the four first solder balls 13 in the second row of solder balls 1202 and the third row of solder balls 1203 may be respectively located at four vertices of the other parallelogram. It may be understood that a connection line between the two first solder balls 13 in the second row of solder balls 1202 is a common side of the two parallelograms. The two parallelograms may be arranged axisymmetric about the common side. In this case, the two parallelograms arranged based on the common side may be spliced into a dovetail. Therefore, in this embodiment of this disclosure, the six first solder balls 13 in the first solder ball structure 12 may also be understood as being separately arranged at six vertices of the dovetail, and the common side is a central axis of the dovetail.

It should be noted that, in FIG. 2 and the following accompanying drawings, dashed connection lines between solder balls are merely used to indicate a position relationship of the solder balls, and do not exist in a specific structure of a package substrate. Therefore, the dashed connection lines do not constitute a limitation on the specific structure of the package substrate.

In specific design, there may be a plurality of choices for inner angles of the two parallelograms. This is not limited in this disclosure. For example, four interior angles $\alpha 1$, $\alpha 2$, $\alpha 3$, and $\alpha 4$ of each of the two parallelograms may be respectively 60 degrees (°), 120°, 60°, and 120°.

In some embodiments, the package substrate 10 may be a substrate configured to package a semiconductor chip, and pins of the semiconductor chip may be connected to a plurality of first solder balls 13 on the package substrate 10 by using leads. Therefore, the first solder balls 13 of the first solder ball structures 12 may also be understood as pins of the package substrate 10.

Figure 3:
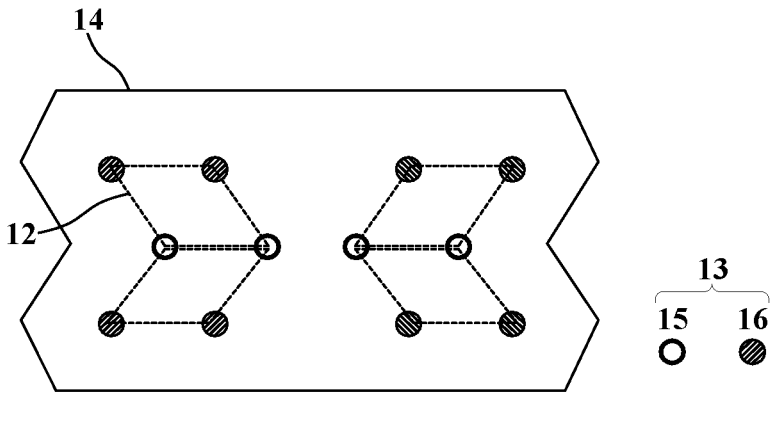
FIG. 3 is a schematic diagram of a structure of an arrangement of first solder balls on a package substrate according to an embodiment of this disclosure.

FIG. 3 is a schematic diagram of a structure of arrangement of first solder balls on a package substrate according to an embodiment of this disclosure. As shown in FIG. 3, in this embodiment of this disclosure, two adjacent first solder ball structures 12 may form a unit region 14 in a geometric arrangement shape, and a plurality of unit regions 14 form a pin region of the package substrate. In each unit region 14, two first solder ball structures 12 may be arranged opposite to each other, and central axes of the two first solder ball structures 12 are collinear.

In an example, each unit region 14 may correspond to data signals of a single byte unit, or the first solder balls 13 included in the two first solder ball structures 12 are configured to transmit data signals of a single byte unit. Each byte unit may usually include four differential signals and eight single-ended signals, and the four differential signals may be further divided into two pairs of differential signals.

Two signals of each pair of differential signals have equal amplitudes and opposite phases.

The six first solder balls 13 in the first solder ball structure 12 may include two differential signal solder balls 15 and four single-ended signal solder balls 16, and the two differential signal solder balls 15 are a pair of differential signal solder balls 15. It may be understood that, in each unit region 14, two pairs of differential signal solder balls 15 of the two first solder ball structures 12 may correspond to two pairs of differential signals in a single byte unit, and eight single-ended signal solder balls 16 may correspond to eight single-ended signals in a single byte unit.

Still as shown in FIG. 3, in the first solder ball structure 12, the two differential signal solder balls 15 may be arranged on a central axis of a dovetail shape, that is, a side formed by the connection line of the two differential signal solder balls 15 is a common side of the two parallelograms. The four single-ended signal solder balls 16 are respectively arranged at the other four vertices of the dovetail shape. Two single-ended signal solder balls 16 and two differential signal solder balls 15 form a parallelogram, and the other two single-ended signal solder balls 16 and the two differential signal solder balls 15 form the other parallelogram.

Based on a dovetail-shaped symmetric structure, single-ended signal solder balls 16 and 16 in the first solder ball structure 12 are symmetrically distributed on two sides of a pair of differential signal solder balls 15. Because two signals of a pair of differential signals have equal amplitudes and opposite phases, impact of the differential signal solder balls 15 on the single-ended signal solder balls 16 and 16 may be mutually offset, thereby reducing electromagnetic crosstalk caused by differential signals to single-ended signals. Similarly, single-ended signal solder balls 16 and 16 in the first solder ball structure 12 are also symmetrically distributed on two sides of the pair of differential signal solder balls 15. Therefore, impacts of the differential signal solder balls 15 on the single-ended signal solder balls 16 and 16 may also be mutually offset, thereby reducing electromagnetic crosstalk caused by differential signals to single-ended signals.

In addition, it can be learned from FIG. 3 that, in this embodiment of this disclosure, there is only one single-ended signal solder ball 16 adjacent to each single-ended signal solder ball 16, that is, a quantity of single-ended signal solder balls 16 arranged around each single-ended signal solder ball 16 is small, so that electromagnetic crosstalk between single-ended signal solder balls 16 can be reduced.

Figure 4:
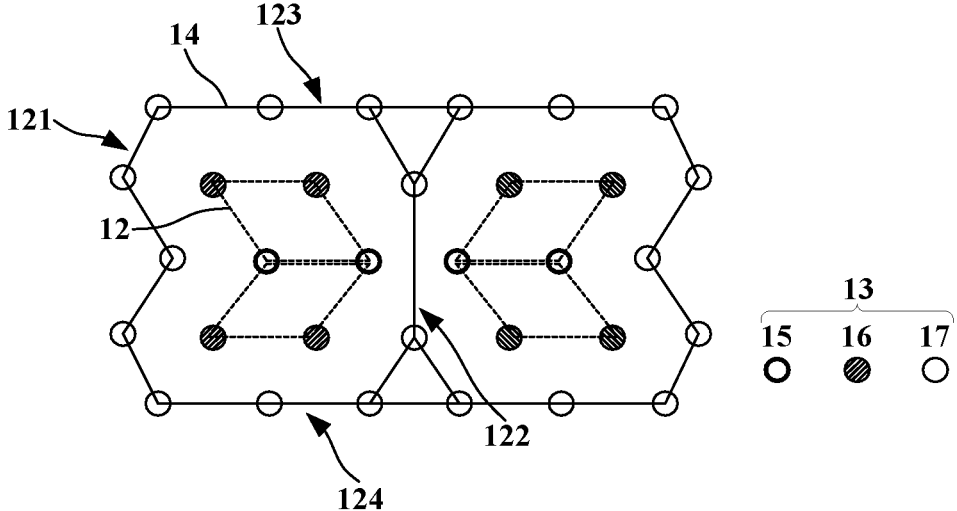
FIG. 4 is a schematic diagram of a structure of another arrangement of solder balls on a package substrate according to an embodiment of this disclosure.

FIG. 4 is a schematic diagram of a structure of another arrangement of solder balls on a package substrate according to an embodiment of this disclosure. As shown in FIG. 4, in this embodiment of this disclosure, ground solder balls 17 may be further arranged around a first solder ball structure 12, and there may be a plurality of ground solder balls 17, to form return current solder balls around the first solder ball structure 12, thereby reducing electromagnetic interference to other solder balls.

In some embodiments, 11 ground solder balls 17 may be arranged around the first solder ball structure 12. Three ground solder balls 17 are arranged on a first side 121 that is of the first solder ball structure 12 and that is away from another first solder ball structure 12 in a same unit region 14. The three ground solder balls 17 on this side are respectively located at three vertices of an isosceles corner, and two sides of the corner are respectively parallel to the sides that are of two parallelograms and that face the first side 121. Two ground solder balls 17 are arranged on a second side 122 opposite to the first side 121, and a connection line of the two ground solder balls 17 on the side 122 is arranged perpendicular to a central axis of a dovetail shape. A third side 123 and a fourth side 124 adjacent to the first side 121 each are provided with three ground solder balls 17. The three ground solder balls 17 on the third side 123 are arranged in a straight line, which is parallel with the central axis of the dovetail shape. The three ground solder balls 17 on the fourth side 124 are also arranged in a straight line, which is also parallel with the central axis of the dovetail shape.

It may be understood that, among the three ground solder balls 17 on the third side 123, the ground solder ball 17 closest to the first side 121 may also be considered to be located on the first side 121, and among the three ground solder balls on the fourth side 124, the ground solder ball 17 closest to the first side 121 may also be considered to be located on the first side 121. In this way, it may be considered that five ground solder balls 17 are arranged on the first side 121, and connection lines of the five ground solder balls 17 are arranged in a sawtooth shape with four sides. Similarly, among the three ground solder balls 17 on the third side 123, the ground solder ball 17 closest to the second side 122 may also be considered to be located on the second side 122, and among the three ground solder balls 17 on the fourth side 124, the ground solder ball 17 closest to the second side 122 may also be considered to be located on the second side 122. In this way, it may be considered that four ground solder balls 17 are arranged on the second side 122, and connection lines of the four ground solder balls 17 are arranged in an isosceles trapezoid shape. In other words, in this embodiment, connection lines of the 11 ground solder balls arranged around the first solder ball structure 12 present as a nonagonal shape. This arrangement manner can better match a dovetail-shaped arrangement form of the first solder ball structure 12, so that the 11 ground solder balls 17 may be close to outer sides of the single-ended signal solder balls 16, thereby reducing an arrangement area of the ground solder balls 17 and further enabling the package substrate to accommodate more solder balls.

In addition, the ground solder balls 17 are arranged in a nonagon around the first solder ball structure 12, so that more ground solder balls 17 may be arranged around each single-ended signal solder ball 16. For example, in the embodiment shown in FIG. 3, at least three ground solder balls 17 may be arranged around each single-ended signal solder ball 16, thereby effectively reducing electromagnetic interference between signals.

In each unit region 14, the two first solder ball structures 12 may share ground solder balls 17. For example, the first solder ball structure 12 on the left side and the first solder ball structure 12 on the right side may share two ground solder balls 17 in between them, that is, the two ground solder balls 17 on the second side of the first solder ball structure 12. In this way, a quantity of ground solder balls 17 may be reduced without compromising a signal anti-interference capability, thereby reducing the arrangement area of ground solder balls 17 and manufacturing costs of the package substrate.

During specific arrangement, a spacing between solder balls is not limited in this embodiment of this disclosure, and may be further designed according to an actual use requirement. In some embodiments, a spacing between adjacent solder balls may be 0.8 millimeters (mm) to 1.2 mm. For example, a value of the spacing between adjacent solder balls may be 0.8 mm, 0.9 mm, 1 mm, 1.1 mm, 1.2 mm, or the like.

Figure 5:
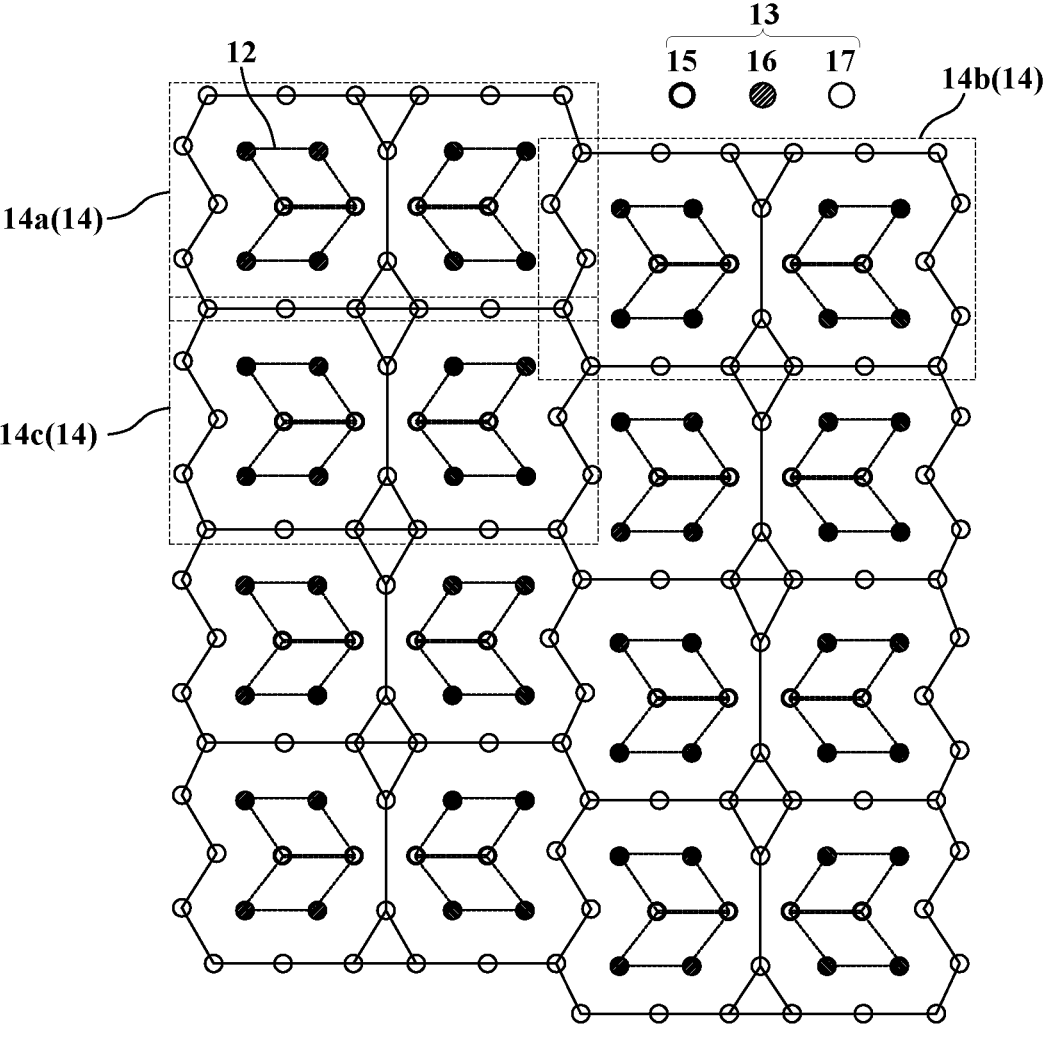
FIG. 5 is a schematic diagram of a structure of an arrangement of unit regions on a package substrate according to an embodiment of this disclosure.

FIG. 5 is a schematic diagram of a structure of an arrangement of unit regions on a package substrate according to an embodiment of this disclosure. With reference to both FIG. 4 and FIG. 5, in this embodiment of this disclosure, unit regions 14 may extend horizontally or vertically to form a pin region of the package substrate. It can be learned from FIG. 5 that both a left side and a right side of a unit region 14 are in a sawtooth shape, and both an upper side and a lower side of the unit region 14 are straight-line sides. In specific design, two unit regions 14 adjacent in a row direction may be staggered in a column direction. For two adjacent first solder ball structures 12 that are located in two unit regions 14 adjacent in a row direction, first sides 121 of the two first solder ball structures 12 have an overlapping part, and the two adjacent unit regions 14 in the row direction may share a plurality of ground solder balls 17 located in the overlapping part. That is, the right sawtooth side of a left unit region 14*a* may match the left sawtooth side of a right unit region 14*b*, and a first solder ball structure 12 disposed close to the right side in the left unit region 14*a* and a first solder ball structure 12 disposed close to the left side in the right unit region 14*b* may share three ground solder balls 17 in the overlapping part. In this way, an arrangement area of ground solder balls 17 may be reduced, and the left and right unit regions 14 may further share a part of ground solder balls 17, so that a quantity of ground solder balls 17 arranged may be reduced without compromising a signal anti-interference capability.

In addition, two unit regions 14 that are adjacent in a column direction may be symmetrically arranged. For the two symmetric first solder ball structures 12 that are respectively located in the two unit regions 14 that are adjacent in a column direction, a third side 123 of one first solder ball structure 12 overlaps a fourth side 124 of the other first solder ball structure 12, and a plurality of ground solder balls 17 on the overlapping side may be shared. For example, in the unit region 14*a* and a unit region 14*c* shown in FIG. 5, the straight-line side of a lower side (a fourth side) of the upper unit region 14*a* may overlap the straight-line side of an upper side (a third side) of the lower unit region 14*c*, and the unit region 14*a* and the unit region 14*c* may share three ground solder balls 17 on the overlapping side. Similarly, this arrangement manner may not only reduce an arrangement area of ground solder balls 17, but enable part of ground solder balls 17 to be shared by the upper and lower unit regions 14, thereby reducing a quantity of arranged ground solder balls 17 without compromising the signal anti-interference capability.

It should be noted that the package substrate provided in this embodiment of this disclosure may be configured to match a CPU chip. In other words, the package substrate in this embodiment of this disclosure may be configured to package a CPU. The following describes a specific matching manner between the package substrate and the CPU.

Figure 6:
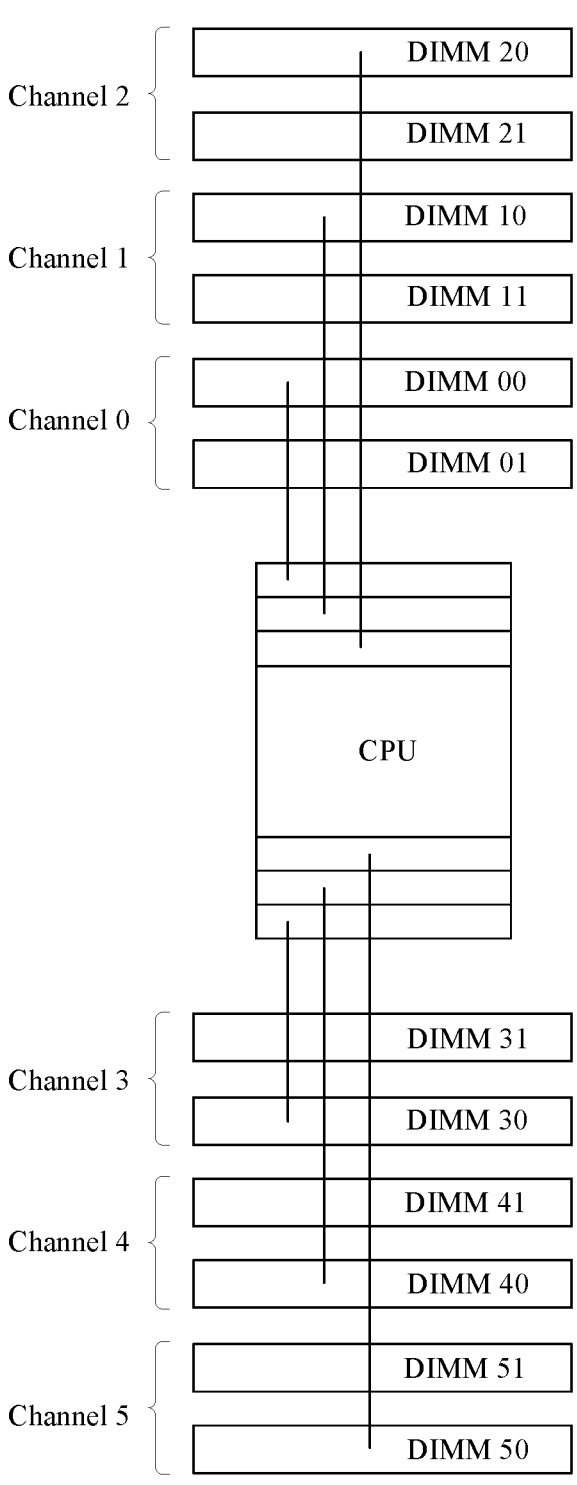
FIG. 6 is a schematic diagram of a hardware architecture of a central processing unit (CPU) double data rate (DDR) interface according to an embodiment of this disclosure.

FIG. 6 is a schematic diagram of a hardware architecture of a DDR synchronous dynamic random-access memory (SDRAM) interface of a CPU according to an embodiment of this disclosure. With reference to FIG. 6, usually there are a plurality of DDR channels on the CPU side, and each DDR channel may drive and connect to one or more memory modules, for example, dual in-line memory modules (DIMM). The foregoing channel may be a memory channel configured for the CPU, and a memory bandwidth of a channel is usually 32 bits or 64 bits.

For example, the CPU may include six DDR channels, which are respectively numbered 0, 1, 2, 3, 4, and 5. Channel 0 may be connected to two memory modules DIMM 00 and DIMM 01, channel 1 may be connected to two memory modules DIMM 10 and DIMM 11, channel 2 may be connected to two memory modules DIMM 20 and DIMM 21, channel 3 may be connected to two memory modules DIMM 30 and DIMM 31, channel 4 may be connected to two memory modules DIMM 40 and DIMM 41, and channel 5 may be connected to two memory modules DIMM 50 and DIMM 51. It should be understood that the CPU in this embodiment of this disclosure is not limited to the architecture shown in FIG. 1. A quantity of channels of the CPU and a quantity of memory modules that are correspondingly connected to each channel may be set depending on an actual requirement. Details are not described herein again.

Figure 7:
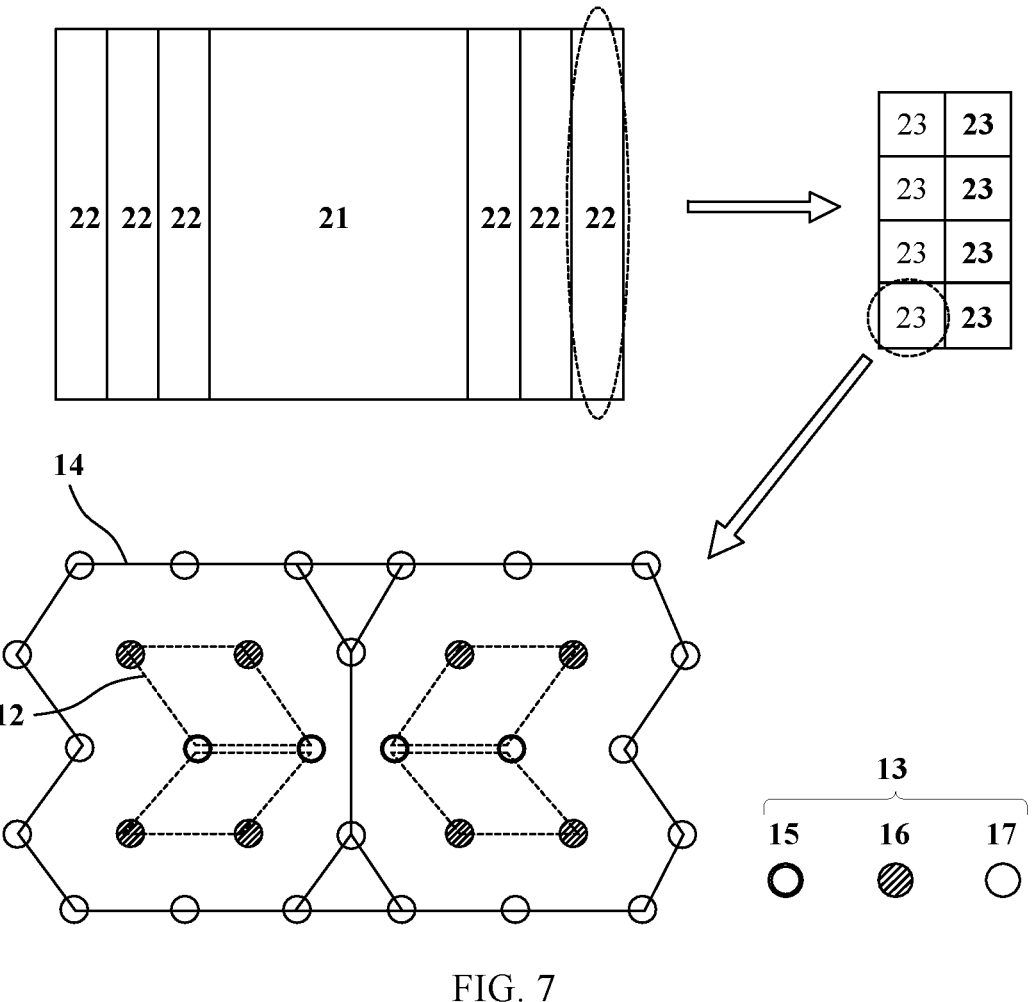
FIG. 7 is a schematic diagram of a CPU DDR interface according to an embodiment of this disclosure.

FIG. 7 is a schematic diagram of a DDR interface of a CPU according to an embodiment of this disclosure. As shown in FIG. 6 and FIG. 7, a DDR channel 22 on the CPU 21 side may include a plurality of byte units 23 formed by 8 bits. It may be understood that, when a memory bandwidth of the DDR channel 22 is 32 bits, the DDR channel 22 may include four byte units 23, when the memory bandwidth of the DDR channel 22 is 64 bits, the DDR channel 22 may include eight byte units 23. The embodiment shown in FIG. 6 is described by using an example in which the memory bandwidth of the DDR channel 22 is 64 bits.

In this embodiment, each byte unit 23 may correspond to one of the foregoing unit regions 14, that is, each byte unit 23 may correspond to two first solder ball structures 12. For the DDR channels 22 whose memory bandwidths are 64 bits, each DDR channel 22 corresponds to eight unit regions 14. The eight unit regions 14 may be arranged in a manner of 4×2 (4 means a quantity of rows arranged in the eight unit regions 14, and 2 means a quantity of columns arranged in the eight unit regions 14) shown in FIG. 4 or 2×4, or may be arranged in a same row or a same column. The specific arrangement may be performed based on space division on the package substrate. This is not limited in this disclosure.

As proved by experiments, electromagnetic crosstalk between DDR data signals can be reduced to −33.6 decibels (dB) by using the package substrate provided in this embodiment of this disclosure to package the CPU and by using a dovetail-shaped pin layout solution of first solder ball structures 12. In addition, if it is assumed that a usable area of a unit region in a conventional trapezoidal arrangement manner is 1, a usable area of the unit region 14 in a dovetail-shaped arrangement manner in this embodiment of this disclosure is approximately 0.95. Therefore, a packaging area can be effectively reduced.

Therefore, the dovetail-shaped pin layout solution used on the package substrate provided in this embodiment of this disclosure may not only reduce electromagnetic crosstalk between DDR data signals and enable a CPU to support a higher DDR running rate, but increase utilization of pins on the package substrate, thereby effectively reducing a packaging area and helping reduce development costs of a semiconductor device.

The foregoing descriptions are merely specific implementation of this disclosure, but are not intended to limit the protection scope of this disclosure. Any variation or replacement readily figured out by a person skilled in the art within the technical scope disclosed in this disclosure should fall within the protection scope of this disclosure. Therefore, the protection scope of this disclosure shall be subject to the protection scope of the claims.

What is claimed is:
1. A semiconductor device comprising:
a package substrate comprising:
a substrate body; and a plurality of unit regions arranged on the substrate body, wherein each of the unit regions comprises two first pin structures, wherein each of the two first pin structures comprises six first pins, wherein the six first pins are disposed in three parallel rows of two pins, and wherein the three parallel rows of two pins comprises:

a first row of single-ended signal pins;

a second row of differential signal pins; and a third row of single-ended signal pins, wherein the two pins in the first row of pins and the two pins in the second row of pins are located at four vertices of a first parallelogram, wherein the two pins in the second row of pins and the two pins in the third row of pins are located at four vertices of a second parallelogram, wherein the first parallelogram and the second parallelogram are arranged axisymmetric about the second row of pins, wherein in each of the unit regions, the two first pin structures are arranged in a row direction of the second row of pins, and wherein the two first pin structures are axisymmetric, and wherein in each of the unit regions, a first distance between first rows of pins in the two first pin structures is greater than a second distance between second rows of pins in the two first pin structures; and a chip disposed on the package substrate and operably coupled with the six first pins.

2. The semiconductor device of claim 1, further comprising ground pins disposed around each first pin structure of the two first pin structures.

3. The semiconductor device of claim 2, wherein a quantity of the ground pins is 11, and wherein the semiconductor device further comprises connection lines connected to the ground pins, sequentially spaced and arranged along a periphery of the first pin structure, and defining a nonagon.

4. The semiconductor device of claim 3, wherein, in each of the unit regions, the two first pin structures are arranged in a row direction of the second row of pins, wherein the two first pin structures are axisymmetric, wherein a first distance between first rows of pins in the two first pin structures is greater than a second distance between second rows of pins in the two first pin structures, and wherein each first pin structure of the two first pin structures comprises:

a first side located away from a remaining first pin structure in a same unit region;

a second side located opposite to the first side;

a third side located between the first side and the second side;

a fourth side located between the first side and the second side and further located opposite to the third side;

first three ground pins disposed on the first side, located at three vertices of an isosceles triangle, wherein two legs of the isosceles triangle are parallel to sides that are of the first parallelogram and the second parallelogram and that face the first side;

two ground pins disposed on the second side, wherein a connection line of the two ground pins is orthogonal to the row direction;

second three ground pins disposed on the third side and sequentially spaced and arranged in the row direction; and third three ground pins disposed on the fourth side and sequentially spaced and arranged in the row direction.

5. The semiconductor device of claim 4, wherein, in each of the unit regions, the two first pin structures share the two ground pins.

6. The semiconductor device of claim 4, wherein the first rows of pins, the second rows of pins, and the third row of pins are sequentially disposed in a column direction, and wherein two adjacent unit regions in the row direction are staggered in the column direction and share some of the ground pins.

7. The semiconductor device of claim 4, wherein the first rows of pins, the second rows of pins, and the third row of pins are sequentially disposed in a column direction, and wherein two adjacent unit regions in the column direction are symmetrically arranged and share some of the ground pins.

8. The semiconductor device of claim 1, wherein, in each first pin structure of the two first pin structures, a first pin and a connection line of two adjacent first pins form an equilateral triangle.

9. The semiconductor device of claim 1, wherein connection lines of three adjacent pins in a plurality of first pins and a plurality of ground pins form an equilateral triangle.

10. The semiconductor device of claim 1, wherein the chip is a central processing unit comprising a plurality of memory channels, wherein each of the memory channels comprises a plurality of byte units, wherein each byte unit corresponds to one unit region, and wherein the single-ended signal pins in the one unit region are configured to transmit data signals of a corresponding byte unit.

11. An electronic device comprising:

a circuit board; and a semiconductor device disposed on the circuit board and comprising:

a package substrate comprising:

a substrate body; and a plurality of unit regions arranged on the substrate body, wherein each of the unit regions comprises two first pin structures, wherein each of the two first pin structures comprises six first pins, wherein the six first pins are disposed, with two of the six first pins in a row, to form three parallel rows of two pins, and wherein the three parallel rows of two pins comprises:

a first row of single-ended signal pins;

a second row of differential signal pins; and a third row of single-ended signal pins, wherein the two pins in the first row of pins and the two pins in the second row of pins are located at four vertices of a first parallelogram, wherein the two pins in the second row of pins and the two pins in the third row of pins are located at four vertices of a second parallelogram, wherein the first parallelogram and the second parallelogram are arranged axisymmetric about the second row of pins, wherein in each of the unit regions, the two first pin structures are arranged in a row direction of the second row of pins, and wherein the two first pin structures are axisymmetric, wherein in each of the unit regions, a first distance between first rows of pins in the two first pin structures is greater than a second distance between second rows of pins in the two first pin structures, and wherein the single-ended signal pins and the differential signal pins are disposed on the circuit board and are electrically coupled to the semiconductor device; and a chip disposed on the package substrate and operably coupled with the six first pins.

12. The electronic device of claim 11, wherein the semiconductor device further comprises ground pins disposed around each first pin structure of the two first pin structures.

13. The electronic device of claim 12, wherein a quantity of the ground pins is 11, and wherein the electronic device further comprises connection lines connected to the ground pins, sequentially spaced and arranged along a periphery of the first pin structure, and defining a nonagon.

14. The electronic device of claim 13, wherein, in each of the unit regions, the two first pin structures are arranged in a row direction of the second row of pins, wherein the two first pin structures are axisymmetric, wherein a first distance between first rows of pins in the two first pin structures is greater than a second distance between second rows of pins in the two first pin structures, and wherein each first pin structure of the two first pin structures comprises:

a first side located away from a remaining first pin structure in a same unit region;

a second side located opposite to the first side;

a third side located between the first side and the second side;

a fourth side located between the first side and the second side and further located opposite to the third side;

first three ground pins disposed on the first side, located at three vertices of an isosceles triangle, wherein two legs of the isosceles triangle are parallel to sides that are of the first parallelogram and the second parallelogram and that face the first side;

two ground pins disposed on the second side, wherein a connection line of the two ground pins is orthogonal to the row direction;

second three ground pins disposed on the third side and sequentially spaced and arranged in the row direction; and third three ground pins disposed on the fourth side and sequentially spaced and arranged in the row direction.

15. The electronic device of claim 14, wherein, in each of the unit regions, the two first pin structures share the two ground pins.

16. The electronic device of claim 14, wherein the first rows of pins, the second rows of pins, and the third row of pins are sequentially disposed in a column direction, and wherein two adjacent unit regions in the row direction are staggered in the column direction and share some of the ground pins.

17. A package substrate comprising:

a substrate body; and a plurality of unit regions arranged on the substrate body, wherein each of the unit regions comprises two first pin structures, wherein each of the two first pin structures comprises six first pins, wherein the six first pins are disposed in three parallel rows of two pins, and wherein the three parallel rows of two pins comprises:

a first row of single-ended signal pins;

a second row of differential signal pins; and a third row of single-ended signal pins, wherein the two pins in the first row of pins and the two pins in the second row of pins are located at four vertices of a first parallelogram, wherein the two pins in the second row of pins and the two pins in the third row of pins are located at four vertices of a second parallelogram, wherein the first parallelogram and the second parallelogram are arranged axisymmetric about the second row of pins, wherein in each of the unit regions, the two first pin structures are arranged in a row direction of the second row of pins, and wherein the two first pin structures are axisymmetric, and wherein in each of the unit regions, a first distance between first rows of pins in the two first pin structures is greater than a second distance between second rows of pins in the two first pin structures.

18. The package substrate of claim 17, further comprising ground pins disposed around each first pin structure of the two first pin structures.

19. The package substrate of claim 17, wherein, in each first pin structure of the two first pin structures, a first pin and a connection line of two adjacent first pins form an equilateral triangle.

20. The package substrate of claim 17, wherein connection lines of three adjacent pins in a plurality of first pins and a plurality of ground pins form an equilateral triangle.

* * * * *